United States Patent [19]

Nawata et al.

[11] Patent Number: 4,678,935
[45] Date of Patent: Jul. 7, 1987

[54] INNER BIAS CIRCUIT FOR GENERATING ECL BIAS VOLTAGES FROM A SINGLE COMMON BIAS VOLTAGE REFERENCE

[75] Inventors: Kazumasa Nawata, Kawasaki; Yasunori Kanai, Inagi, both of Japan

[73] Assignee: Fujitsu Limited, Kawasaki, Japan

[21] Appl. No.: 650,527

[22] Filed: Sep. 14, 1984

[30] Foreign Application Priority Data

Sep. 21, 1983 [JP] Japan .................. 58-173197

[51] Int. Cl.$^5$ .................. H03K 17/16; H03K 19/086
[52] U.S. Cl. .................. 307/297; 307/443; 307/455
[58] Field of Search .......... 307/443, 454, 455, 296 R, 307/297; 323/311–314

[56] References Cited

U.S. PATENT DOCUMENTS

| | | | |
|---|---|---|---|
| 4,313,083 | 1/1982 | Gilbert et al. | 323/313 X |
| 4,348,633 | 9/1982 | Davis | 323/314 |
| 4,359,653 | 11/1982 | Takamasa | 307/443 X |
| 4,410,816 | 10/1983 | Kanai | 307/443 X |
| 4,443,753 | 4/1984 | McGlinchey | 323/313 |
| 4,516,039 | 5/1985 | Matsuzaki et al. | 307/443 X |
| 4,527,079 | 7/1985 | Thompson | 307/443 X |

Primary Examiner—Stanley D. Miller
Assistant Examiner—D. R. Hudspeth
Attorney, Agent, or Firm—Staas & Halsey

[57] ABSTRACT

An integrated circuit device having a simplified bias supply circuit for supplying bias power sources for a plurality of circuit units or cell units. The integrated circuit device cmprises: a cell unit array having a plurality of cell units disposed in a central portion of a semiconductor chip; a first power supply line and a second power supply line; and one or more common bias generating portions disposed at the periphery of the cell unit array, each of the common bias generating portions generating a single common bias voltage which differs from the potential of the second power supply line by a constant value. Each of the cell units comprises one or more logic circuit cells such as ECL type logic circuits, and an inner bias circuit which receives the common bias voltage and which generates a first inner bias voltage and a second inner bias voltage that are supplied to the respective logic circuit cell. The second inner bias voltage differs from the common bias voltage by a constant value, and the first inner bias voltage differs from the potential of the first power supply line at the cell unit by the value determined by the values of the elements in the inner bias circuit and by the common bias voltage.

13 Claims, 17 Drawing Figures

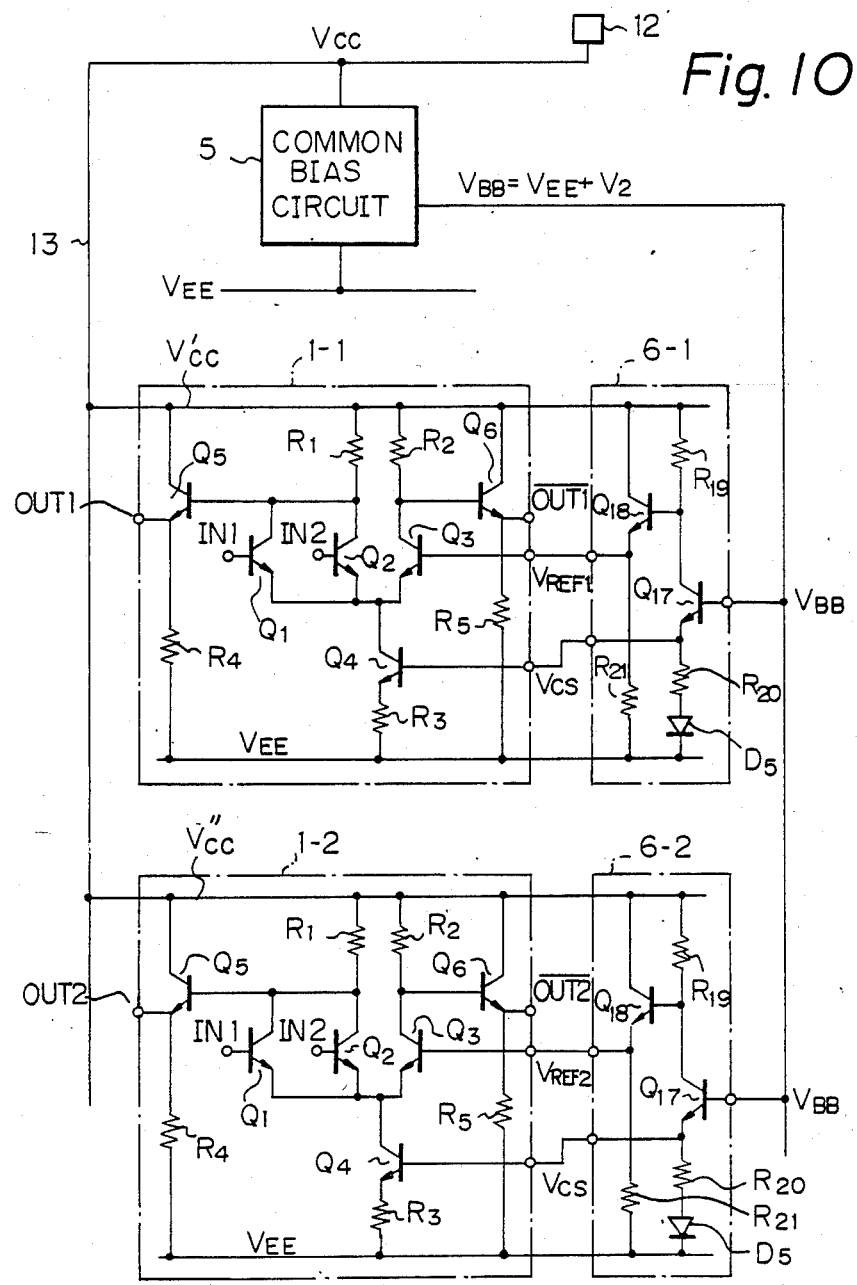

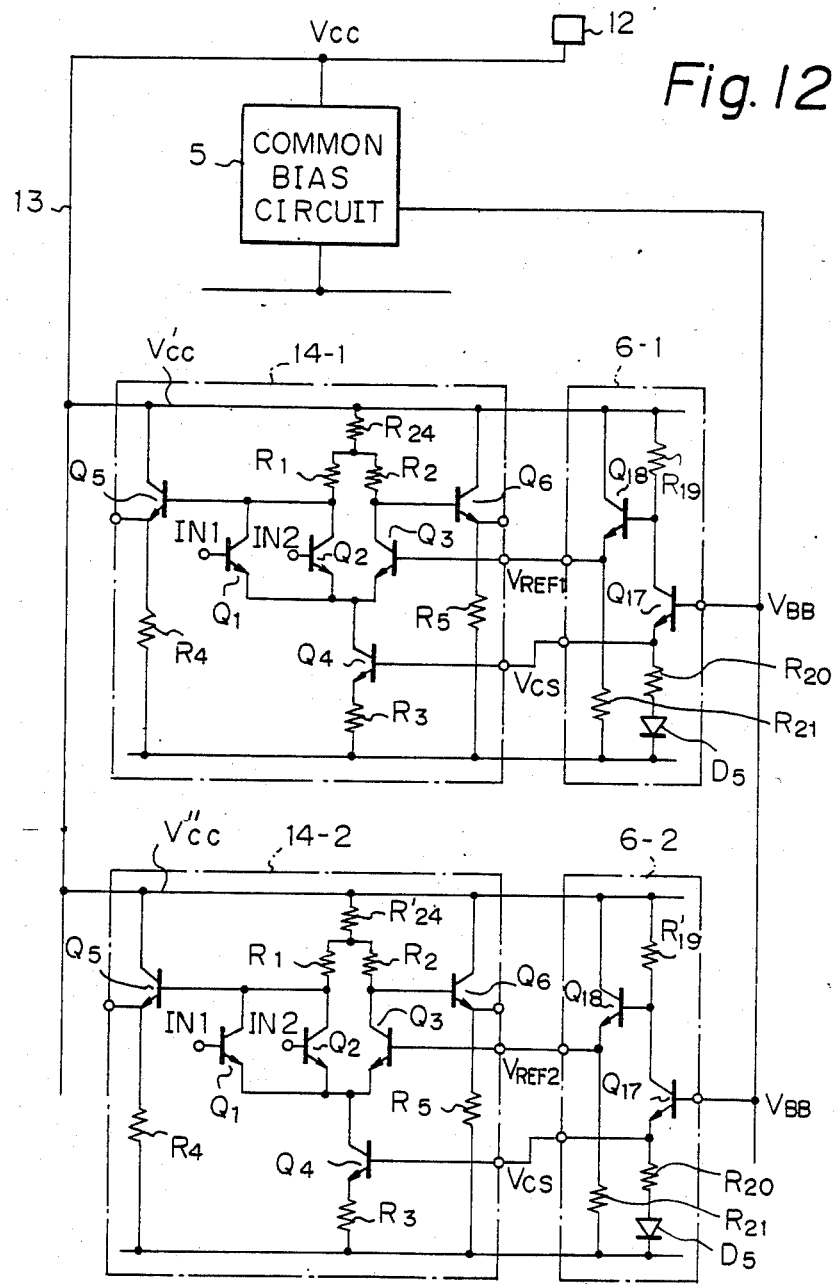

INNER BIAS CIRCUIT FOR GENERATING ECL BIAS VOLTAGES FROM A SINGLE COMMON BIAS VOLTAGE REFERENCE

BACKGROUND OF THE INVENTION

The present invention relates to an integrated circuit device, and, more particularly, to an integrated circuit device having a simplified bias supply circuit for supplying bias power sources for a plurality of circuit units.

In a logic circuit and the like composed of, for example, ECL (emitter coupled logic) circuits, it is necessary to supply a plurality of bias voltages to the constant current source circuits of each logic circuit and to the logic transistor thereof. Therefore, in an integrated circuit device having a large number of such logic circuits, the scale of a bias circuit supplying bias voltages to each logic circuit becomes relatively large, leading to a greater power consumption by the bias circuit itself. To remove these drawbacks, it is necessary to redivise the circuit structure of the bias circuit.

In a conventional integrated circuit device a plurality of bias supply portions are provided, each supplying bias voltages to a corresponding one of a plurality of logic portions. However, such a circuit device is disadvantaged in that the internal circuit of each bias supply portion itself becomes complex, leading to a corresponding increase in the power consumption thereof because each of the bias supply portions must be a stabilized bias voltage generating circuit.

In another conventional integrated circuit device, one common bias circuit and a plurality of inner bias circuits are provided, each of which corresponds to one of a plurality of logic circuit portions. The common bias circuit supplies stabilized bias voltages to each of the logic circuit portions, and each of the inner bias circuits generates and supplies inner bias voltages to the corresponding logic circuit portions.

However, in the above-mentioned integrated circuit device, it is necessary to provide two connection lines between the common bias circuit and each of the inner bias circuits. This means that a large number of connection lines must be used in the bias portion, which reduces the reliability and lowers the degree of integration of the integrated circuit device.

SUMMARY OF THE INVENTION

In view of the problems of the above-mentioned conventional device, in the present invention a bias portion of an integrated circuit device is divided into a common bias circuit and a plurality of inner bias circuits, wherein one kind of stabilized power source is supplied from the common bias circuit to each of the inner bias circuits, and each of the inner bias circuits generates the required kinds of bias power sources.

An object of the present invention is to decrease the number of connection lines between each circuit, thereby increasing the reliability and the degree of integration of an integrated circuit device.

According to the present invention, this object is attained by providing an integrated circuit device comprising: a cell unit array having a plurality of cell units and being disposed in a central portion of a semiconductor chip; a first power supply line ($V_{CC}$) and a second power supply line ($V_{EE}$); and one or more common bias generating portions disposed in the periphery of the cell unit array, each of the common bias generating portions generating a single common bias voltage ($V_{BB}$) which differs from the potential of the second power supply line ($V_{EE}$) by a constant value. Each of the cell units comprises one or more logic circuit cells, each having at least a pair of logic transistors connected to the side of the first power supply line and having mutually connected emitters, and a constant current source means connected to the side of the second power supply line which supplies a constant current to the logic transistors. An inner bias circuit receives the common bias voltage and generates a first inner bias voltage ($V_{REF}$) supplied to the base of one of the logic transistors and a second inner bias voltage ($V_{CS}$) supplied to the constant current source means, the second inner bias voltage differing from the common bias voltage by a constant value, and the first inner bias voltage differing from the potential of the first power supply line at the cell unit by the value determined by the elements used in the inner bias circuit and by the common bias voltage.

BRIEF DESCRIPTION OF THE DRAWINGS

FIG. 10 is a circuit diagram illustrating an example of the detailed circuit structure of the device of FIG. 8;

FIG. 12 is a circuit diagram illustrating another example of the detailed circuit structure of the device of FIG. 8;

DESCRIPTION OF THE PREFERRED EMBODIMENTS

Before describing the preferred embodiments, an explanation will be given of bias supply systems of conventional integrated circuit devices with reference to FIGS. 1 through 7.

Figure 1:
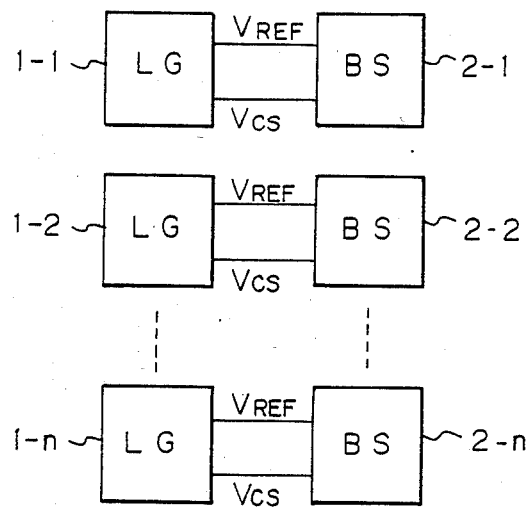
FIG. 1 and FIG. 2 are block circuit diagrams each illustrating a structure of a prior art integrated circuit device.

FIG. 1 illustrates a structure of a conventional ECL-type integrated circuit device. The device of FIG. 1 comprises a plurality of logic portions 1-1, 1-2, - - -, 1-n, and bias portions 2-1, 2-2, - - -, 2-n each of which supplies two kinds of bias voltages $V_{REF}$ and $V_{CS}$ to each of these logic portions. The bias voltages $V_{REF}$ and $V_{CS}$ are used as the reference voltage of a current switch circuit and the reference voltage of a constant current source of an ECL circuit in each of the logic portions 1-1, 1-2, - - -, 1-n, respectively.

The circuit device of FIG. 1 has an advantage in that the circuit structure of the whole device is simple and the connections between circuits are small. However, as mentioned before the circuit device is disadvantaged in that the internal circuit of each bias portion itself becomes complex and the power consumption of each bias portion is increased, because each of the bias portions must be a stabilized bias voltage generating circuit.

Figure 2:
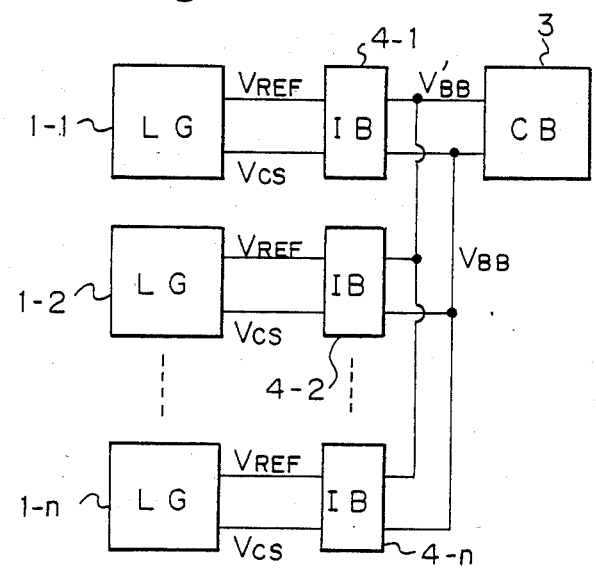

FIG. 2 illustrates a structure of another conventional ECL circuit device. In the device of FIG. 2, a bias portion is divided into one common bias circuit 3 and a plurality of inner bias circuits 4-1, 4-2, - - -, 4-n corresponding to logic circuit portions 1-1, 1-2, - - -, 1-n, respectively. The common bias circuit 3 supplies two kinds of stabilized bias voltages $V'_{BB}$ and $V_{BB}$ to each of the inner bias circuits 4-1, 4-2, - - -, 4-n, and each inner bias circuit generates and supplies two kinds of bias voltages $V_{REF}$ and $V_{CS}$ to the corresponding logic portions.

Figure 3:
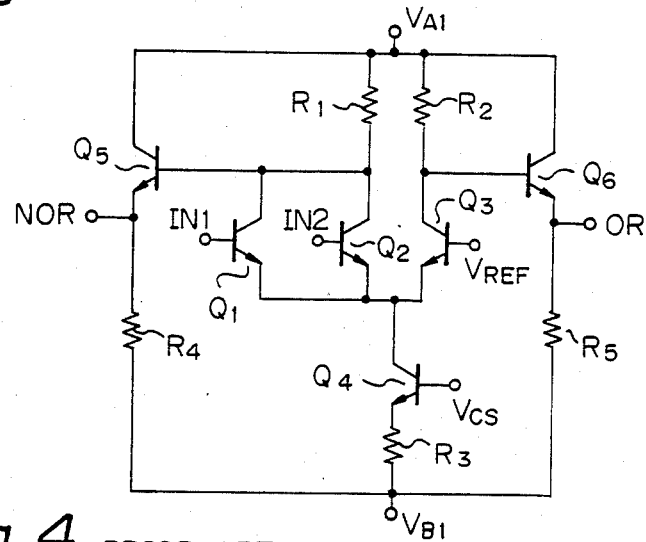
FIG. 3 is an electric circuit diagram illustrating an example of a prior art logic portion.

FIG. 3 illustrates a fundamental ECL gate circuit as an example of an inner circuit of each of the abovementioned logic portions 1-1, 1-2, - - -, 1-n. The circuit of: FIG. 3 is composed of transistors $Q_1$, $Q_2$, and $Q_3$ having emitters commonly connected; a transistor $Q_4$ and a resistor $R_3$ inserted between the commonly connected emitters of the transistors $Q_1$, $Q_2$, and $Q_3$ and a power source $V_{B1}$; a transistor $Q_5$ and a resistor $R_4$, and a transistor $Q_6$ and a resistor $R_5$, each constituting an output emitter follower circuit; a collector resistor $R_1$ inserted between commonly connected collectors of the transistors $Q_1$ and $Q_2$ and a power source $V_{A1}$; a collector resistor $R_2$ for the transistor $Q_3$; and so on. The aforementioned bias voltages $V_{REF}$ and $V_{CS}$ are supplied to the base of the transistor $Q_3$ and to the base of the transistor $Q_4$, respectively.

In the circuit of FIG. 3, when at least one of the signals applied to input terminals IN1 and IN2 is high, the transistor $Q_3$ is turned off, so that the potential of an output terminal OR becomes high and the potential of an output terminal NOR becomes low. When the potential of both input terminals IN1 and IN2 is low, both the transistors $Q_1$ and $Q_2$ are turned off and the transistor $Q_3$ is turned on, so that the potential of the output terminal OR becomes low and the potential of the output terminal NOR becomes high. Therefore, the circuit of FIG. 3 operates as an OR logic gate or a NOR logic gate.

Figure 4:
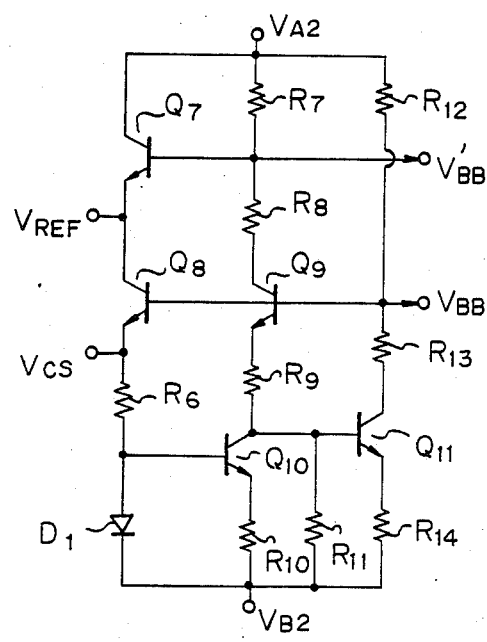
FIG. 4 is an electric circuit diagram illustrating an example of a prior art common bias circuit.

FIG. 4 illustrates a structure of a common bias circuit 3 used in the device of FIG. 2. The circuit of FIG. 4 comprises transistors $Q_7$, $Q_8$ - - -, $Q_{11}$, resistors $R_6$, $R_7$, - - -, $R_{14}$, and a diode $D_1$.

In the circuit of FIG. 4, the voltage between the base of the transistor $Q_{10}$ and a power source $V_{B2}$ is regulated by the diode $D_1$, and thus the collector current of the transistor $Q_{10}$ becomes approximately constant. Therefore, the voltage across the resistor $R_7$ becomes approximately constant and the base voltage of the transistor $Q_7$ becomes approximately constant, so that the output bias voltage $V_{REF}$ becomes approximately constant. Since the resistance of the resistor $R_{14}$ is usually selected to be zero or a very small value, the base voltage of the transistor $Q_{11}$ becomes approximately constant. Therefore, since the voltage drop across the resistor $R_9$ is also approximately constant, the base voltage of the transistors $Q_8$ and $Q_9$ reaches an approximately constant value, and the output bias voltage $V_{CS}$ reaches an approximately constant value. In the circuit of FIG. 4, it is possible to supply the output bias voltages $V_{REF}$ and $V_{CS}$ directly to the logic portion. In the device of FIG. 2, the reference voltages $V'_{BB}$ and $V_{BB}$ are supplied from the common bias circuit to each of the inner bias circuits. In this case, these voltages $V'_{BB}$ and $V_{BB}$ are output from the base of the transistor $Q_7$ and the base of the transistor $Q_8$ ($Q_9$), respectively.

Figure 5:
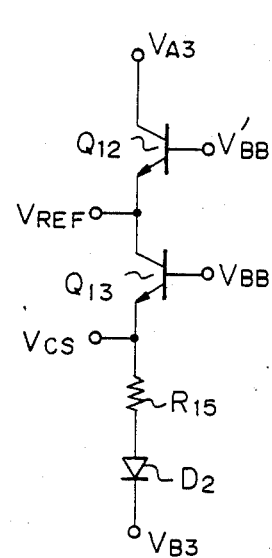
FIG. 5 is an electric circuit diagram illustrating a structure of an inner bias circuit used in a prior art integrated circuit device.

FIG. 5 illustrates an example of an inner bias circuit. The circuit of FIG. 5 is constituted by transistors $Q_{12}$ and $Q_{13}$ connected in series between the power sources $V_{A3}$ and $V_{B3}$, a resistor $R_{15}$, and a diode $D_2$. The reference voltages $V'_{BB}$ and $V_{BB}$ are applied to the bases of the transistors $Q_{12}$ and $Q_{13}$, respectively, from the common bias circuit. The bias voltages $V_{REF}$ and $V_{CS}$ are derived from the emitters of the transistors $Q_{12}$ and $Q_{13}$, respectively, and are supplied to the logic portions.

Figure 6:
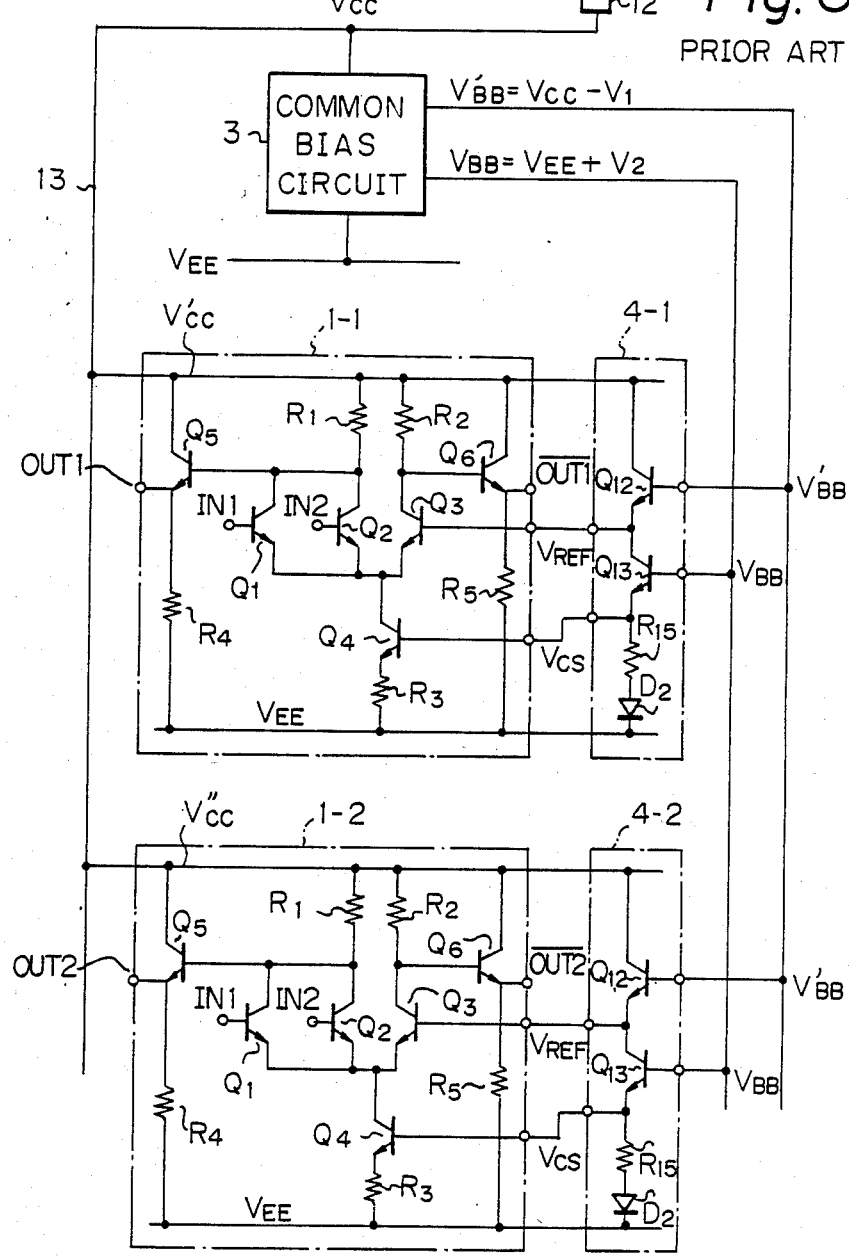
FIG. 6 is a circuit diagram illustrating detailed circuit structure of the device of FIG. 2.

FIG. 6 illustrates a detailed circuit of the device of FIG. 2. In the circuit of FIG. 6, each of the inner bias circuits 4-1, 4-2, - - - is the same as that of FIG. 5, each of the logic portions 1-1, 1-2, - - - is the same as that of FIG. 3, and the common bias circuit 3 is the same as that of FIG. 4. The common bias circuit 3 is usually disposed at the peripheral portion of a semiconductor chip, and a power supply voltage $V_{CC}$ is supplied from a bonding pad 12 to the common bias circuit 3 and to the logic portions 1-1, 1-2, - - - via a power supply line 13.

The common bias circuit 3 generates two kinds of bias voltages, $V'_{BB}$ and $V_{BB}$, and supplies these bias voltages to each of the inner bias circuits 4-1, 4-2, - - - . The bias voltage $V'_{BB}$ has the voltage $V_{CC} - V_1$, where $V_1$ is a constant voltage. The bias voltage $V_{BB}$ has the voltage $V_{EE} + V_2$, where $V_2$ is a constant voltage. Each of the inner bias circuits 4-1, 4-2, - - - generates two kinds of bias voltages, $V_{REF}$ and $V_{CS}$. The bias voltage $V_{REF}$ is lower than the voltage $V'_{BB}$ by a constant voltage, i.e., the base-emitter voltage of the transistor $Q_{12}$, and the bias voltage $V_{CS}$ is lower than the voltage $V_{BB}$ by a constant voltage, i.e., the base-emitter voltage of the transistor $Q_{13}$.

In the circuit of FIG. 6, however, since each of the logic portions 1-1, 1-2, - - - consumes a relatively large power supply current, the power supply voltage $V_{CC}$ drops due to the resistance of the power supply line 13, so that the voltage value of the power supply voltage differs in accordance with the location of the logic portions 1-1, 1-2, - - -, on the semiconductor chip.

Figure 7:
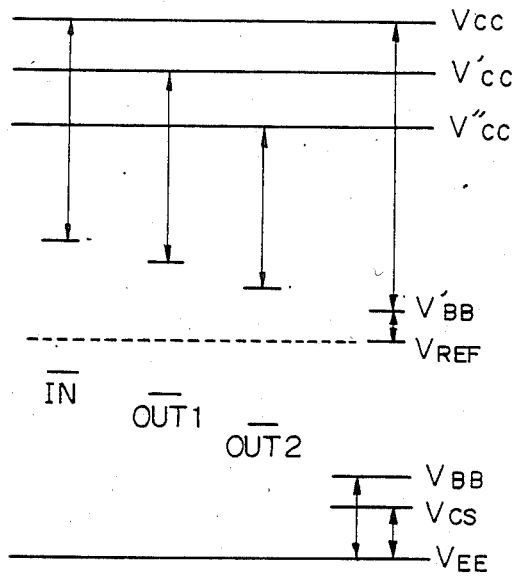
FIG. 7 is an illustration showing relationships of voltage levels in every portion of the circuit of FIG. 6.

Therefore, as illustrated in FIG. 7, the power supply voltage $V'_{CC}$ of the logic portion 1-1 becomes, for example, lower than the power supply voltage $V_{CC}$ of the common bias circuit 3, and the power supply voltage $V'''_{CC}$ of the logic portion 1-2 becomes lower than the power supply voltage $V'_{CC}$ of the logic portion 1-1. Since the voltage levels of the output signal OUT1 of the logic portion 1-1 and of the output signal OUT2 of the logic portion 1-2 vary in accordance with the power supply voltages $V'_{CC}$ and $V'''_{CC}$, respectively, it is impossible to supply the most preferable reference voltage $V_{REF}$ to all the logic portions 1-1, 1-2, and so on.

Moreover, when each input signal IN is supplied to the input terminals IN1 and IN2 from an external circuit, i.e., outside the chip, and if the bias voltage $V_{REF}$ of a logic portion is determined in accordance with inner signals of the device, it becomes impossible to match the voltage levels of the bias voltage $V_{REF}$ and the input signals IN are determined on the basis of the power supply voltage $V_{CC}$.

Moreover, in the circuit device shown by the circuits of FIG. 2 through FIG. 6, it is necessary to provide two connection lines between each of the logic portions 1-1, 1-2, - - -, 1-n and the corresponding inner bias circuits 4-1, 4-2, - - -, 4-n, and to provide two connection lines from the common bias circuit 3 to each of the inner bias circuits 4-1, 4-2, - - -, 4-n. Therefore, the number of connection lines in the bias portion becomes large, so that the reliability of the device is decreased and it becomes difficult to increase the degree of integration of the circuits.

According to the present invention, there is provided an integrated circuit device which overcomes these prior art problems.

Figure 8:
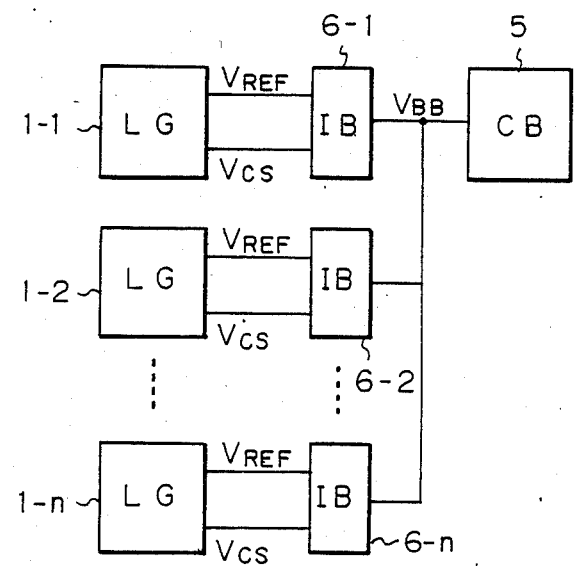
FIG. 8 is a block circuit diagram illustrating a structure of an integrated circuit device as an embodiment of the present invention.

FIG. 8 illustrates a schematic structure of an integrated circuit device as an embodiment of the present invention. In the device of FIG. 8, a bias portion is composed of a common bias circuit 5 and inner bias circuits 6-1, 6-2, - - -, 6-n, each of which supplies bias voltages $V_{REF}$ and $V_{CS}$ to each of logic portions 1-1, 1-2, - - -, 1-n. The device of FIG. 8 differs from that of FIG. 2 in that only one kind of voltage $V_{BB}$ is supplied, as a reference voltage, from the common bias circuit 5 to each of the inner bias circuits 6-1, 6-2, - - -, 6-n, and that each of the inner bias circuits 6-1, 6-2, - - -, 6-n generates two kinds of bias voltages $V_{REF}$ and $V_{CS}$ on the basis of this voltage $V_{BB}$.

Figure 9A:
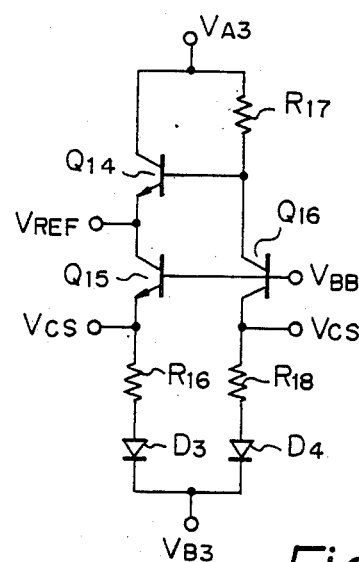
FIGS. 9A, 9B, and 9C are electric circuit diagrams each illustrating a structure of an inner bias circuit used in the device of FIG. 8.
Figure 9B:
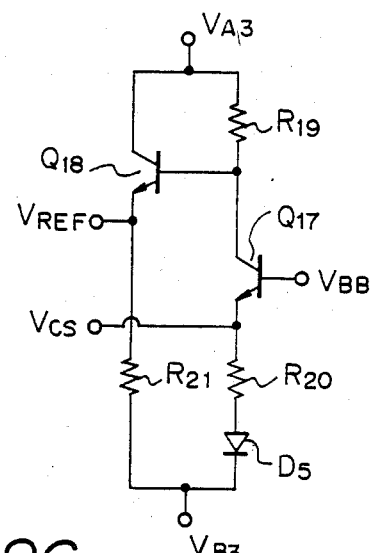
Figure 9C:
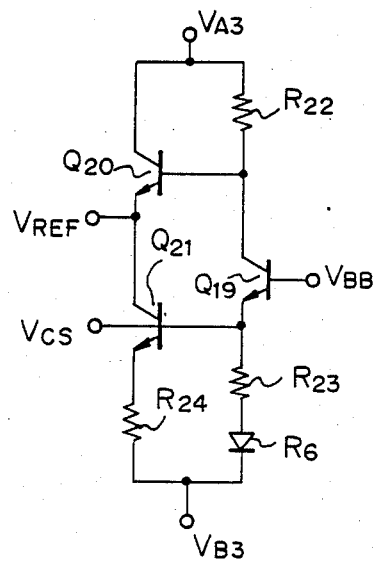

Although the device of FIG. 8 uses a circuit shown in FIG. 4 as the common bias circuit 5, the output voltage $V'_{BB}$ of the circuit of FIG. 4 is not used. Examples of the inner bias circuits that can be used in the device of FIG. 8 are illustrated in FIGS. 9A, 9B, and 9C. The circuit shown in FIG. 9A comprises a circuit having transistors $Q_{14}$ and $Q_{15}$, a resistor $R_{16}$, and a diode $D_3$ serially connected between power sources $V_{A3}$ and $V_{B3}$ and a circuit having a resistor $R_{17}$, a transistor $Q_{16}$, a resistor $R_{18}$, and a diode $D_4$ serially connected between the same power sources $V_{A3}$ and $V_{B3}$. The bases of the transistors are commonly connected to each other, and receive the reference voltage source $V_{BB}$ from the common bias circuit. The collector of the transistor $Q_{16}$ is connected to the base of the transistor $Q_{14}$.

In the circuit of FIG. 9A, when the value of the input reference voltage $V_{BB}$ is constant, the value of the output bias voltage $V_{CS}$ becomes approximately constant. Since the emitter-base voltage of the transistor $Q_{16}$ is constant, the collector current of the transistor $Q_{16}$ becomes approximately constant. Therefore, the voltage across the resistor $R_{17}$ becomes constant, and if the voltage of the power source $V_{A3}$ is constant, the base voltage of the transistor $Q_{14}$ becomes constant so that the output bias voltage $V_{REF}$ becomes approximately constant. It is possible to derive the output bias voltage $V_{CS}$ from either the emitter of the transistor $Q_{15}$ or the emitter of the transistor $Q_{16}$. By using the thusly constituted circuit, it is possible to generate two kinds of stabilized bias voltages, $V_{REF}$ and $V_{CS}$, on the basis of the input reference voltage $V_{BB}$ having a constant voltage.

FIG. 9B illustrates another example of an inner bias circuit. The circuit of FIG. 9B comprises a series circuit of a resistor $R_{19}$, a transistor $Q_{17}$, a resistor $R_{20}$, and a diode $D_5$ connected between a power source $V_{A3}$ and $V_{B3}$ and an emitter follower circuit having a transistor $Q_{18}$ and a resistor $R_{21}$ connected between the same power sources $V_{A3}$ and $V_{B3}$.

The circuit of FIG. 9B is equivalent to a circuit constituted by removing the transistor $Q_{15}$ and the diode $D_3$ from the circuit of FIG. 9A. Therefore, the bias voltage $V_{CS}$ can be derived only from the emitter of the transistor $Q_{17}$. In the circuit of FIG. 9B, since the reference voltage $V_{BB}$ supplied from the common bias circuit is applied only to one transistor $Q_{17}$, the load of the common bias circuit can be made small.

FIG. 9C illustrates still another example of an inner bias circuit. The circuit of FIG. 9C comprises a series circuit of a resistor $R_{22}$, a transistor $Q_{19}$, a resistor $R_{23}$, and a diode $D_5$ connected between power sources $V_{A3}$ and $V_{B3}$, and a series circuit of transistors $Q_{20}$ and $Q_{21}$ and a resistor $R_{24}$ connected between the same voltage sources. In this circuit, it is also possible to output stabilized bias voltages $V_{REF}$ and $V_{CS}$, because the collector and emitter voltages of the transistor $Q_{19}$ become constant in a manner similar to each of the aforementioned circuits. In the circuit of FIG. 9B, a current flows through the series circuit of the transistor $Q_{18}$ and the resistor $R_{21}$ and the power is consumed thereby even when the reference voltage $V_{BB}$ from the common bias circuit is shut off, no idle current flows in the circuit of FIG. 9C because both the transistors $Q_{19}$ and $Q_{21}$ are turned off when the reference voltage $V_{BB}$ is shut off.

Note, in each of the circuits of FIGS. 9A, 9B, and 9C, it is possible to adjust the bias voltage $V_{REF}$ to any voltage level by changing the resistance of the resistors $R_{17}$, $R_{19}$, and $R_{22}$.

FIG. 10 illustrates an example of a detailed circuit of the device of FIG. 8. In the circuit of FIG. 10, each of the inner bias circuits 6-1, 6-2, - - - is the same as that of FIG. 9B, each of the logic portions 1-1, 1-2, - - - is the same as that of FIG. 3, and the common bias circuit 3 is the same as that of FIG. 4.

In the circuit of FIG. 10, the common bias circuit supplies a voltage $V_{BB}$ having the voltage $V_{EE}+V_2$, where $V_2$ is the constant voltage. Therefore, in each of the inner bias circuits 6-1, 6-2, - - -, the emitter current, and thus the collector current, of the transistor $Q_{17}$ becomes constant, so that the voltage across the resistor $R_{19}$ becomes constant.

The bias voltage $V_{REF1}$ generated by the inner bias circuit 6-1 has the voltage lower than $V'_{CC}$ by a constant voltage, i.e., the sum of the voltage drop across the resistor $R_{19}$ and the base-emitter voltage of the transistor $Q_{18}$ therein, and the bias voltage $V_{REF2}$ generated by the inner bias circuit 6-2 has a voltage that is lower than $V''_{CC}$ by a constant voltage, i.e., the sum of the voltage drop across the resistor $R_{19}$ and the base-emitter voltage of the transistor $Q_{18}$ therein.

Figure 11:
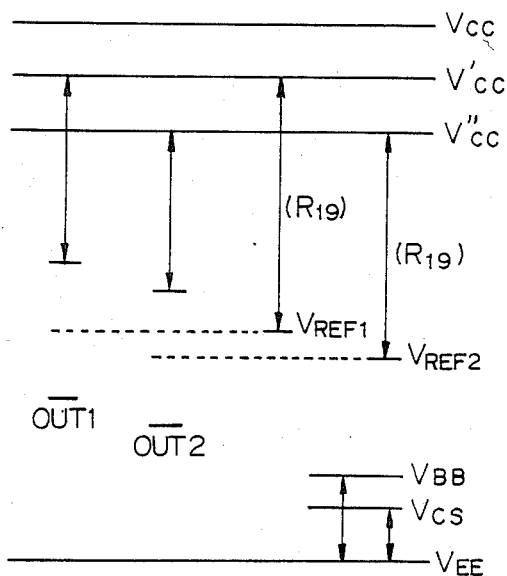
FIG. 11 is an illustration showing relationships of voltage levels in every portion of the circuit of FIG. 10.

Therefore, as illustrated in FIG. 11, it is possible to supply the most preferable bias voltages $V_{REF1}$, $V_{REF2}$, - - - to the logic portions 1-1, 1-2, - - -, although the power supply voltages $V'_{CC}$, $V''_{CC}$, - - -, vary in accordance with the location of each of the logic portions 1-1, 1-2, - - - . In this case, it is not necessary to change the resistance of the resistor $R_{19}$ in each of the inner bias circuits 6-1, 6-2, - - -.

Figure 13:
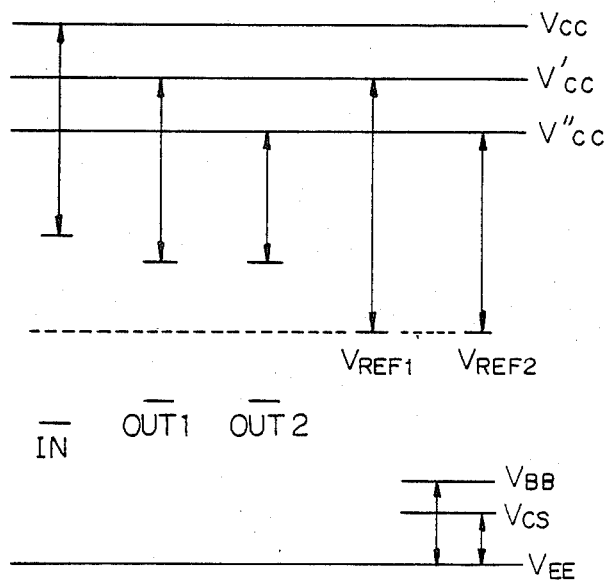
FIG. 13 is an illustration showing relationships of voltage levels in every portion of the circuit of FIG. 12.

FIG. 12 illustrates another example of a detailed circuit of the device of FIG. 8. In the circuit of FIG. 12, each of the logic portions 14-1, 14-2, - - -, differs from the logic portion shown in FIG. 3 and used in the circuit of FIG. 10, in that the logic portions 14-1, 14-2, - - -, each comprise an additional resistor $R_{24}$, $R'_{24}$, - - -, so that the voltage levels of each of the output signals OUT1, OUT2, - - -, become constant regardless of those locations, as shown in FIG. 13.

The resistance of the resistors $R_{19}$, $R'_{19}$, - - -, are also changed in accordance with the locations of the logic portions 14-1, 14-2, - - -, so that the bias voltages $V_{REF1}$, $V_{REF2}$, - - -, become constant and have the most preferable value with respect to the output signals OUT1, OUT2, - - -, and to the input signals IN. The most preferable value of the bias voltage $V_{REF1}$, $V_{REF2}$, - - -, is, for example, the voltage having a value midway between the high level voltage and the low level voltage of each of the output signals OUT 1, OUT2, - - -.

Therefore, in the circuit of FIG. 12, the voltage levels of the external input signals IN having constant values regardless of inner signals, the voltage levels of the inner signals such as the output signals OUT1, OUT2, - - -, which otherwise would differ depending on the location of the logic portions 14-1, 14-2, on the semiconductor chip, and the voltage levels of the bias voltages $V_{REF1}$, $V_{REF2}$, - - - -. are all made uniform, thereby realizing a high noise immunity.

Figure 14A:
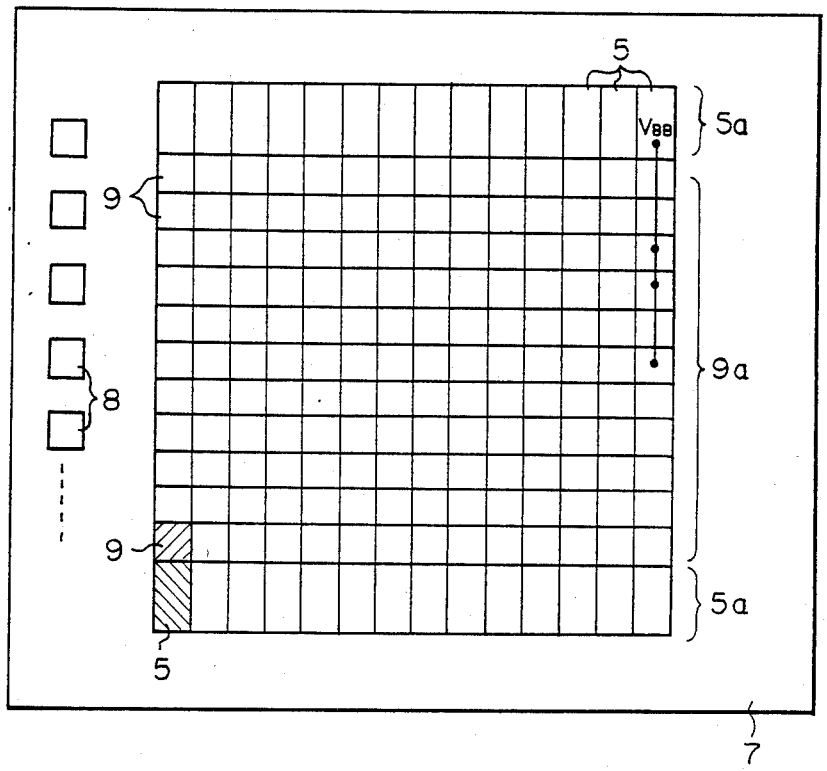
FIG. 14A is a plan view illustrating the layout of each circuit on a semiconductor chip of an integrated circuit device as an embodiment of the present invention.

FIG. 14A illustrates an example of a layout of each circuit in an integrated circuit device, as an embodiment of the present invention, on a semiconductor chip. In FIG. 14A, 7 designates a semiconductor chip, 8 designates bonding pads, and 9 designates circuit cells or cell units each including an inner bias circuit and logic portions. That is, in the structure of FIG. 14A, on, for example, both sides of a centrally located cell region 9a in which the circuit cells 9 are arranged in an array, common bias circuit regions 5a are formed by arranging common bias circuits 5. Connection lines are provided, each applying the reference voltage $V_{BB}$ from each common bias circuit 5 to the circuit cells disposed in the same column in accordance with necessity. In the example of FIG. 14A, the circuit cells are disposed in a matrix of 14 columns and 11 rows, and connection lines for supplying the reference voltage $V_{BB}$ are provided only for the circuit cells which necessitate the voltage in accordance with the kind and characteristics of circuits included in the circuit cells, thereby decreasing the power consumption.

Figure 14B:
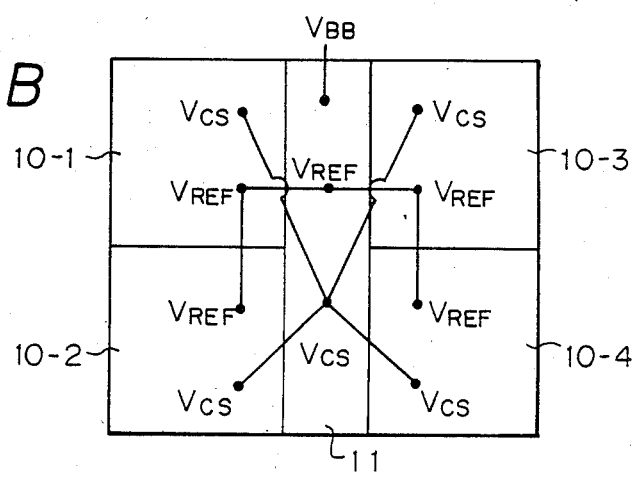
FIG. 14B illustrates a detailed structure of a circuit cell used in the device of FIG. 14A.

FIG. 14B illustrates an example of a structure of each circuit cell 9. The circuit cell of FIG. 14B comprises four logic portions, 10-1, 10-2, 10-3, 10-4, and one inner bias circuit 11. Connection lines are arranged for supplying two kinds of bias voltages, $V_{REF}$ and $V_{CS}$, from the inner bias circuit 11 to each logic portion. A connection line is arranged to the inner bias circuit 11 for supplying the reference voltage $V_{BB}$ from the common bias circuit.

In the structure shown in FIGS. 14A and 14B, each common bias circuit 5 supplies the bias voltages to the logic portions via the inner bias circuit 11 in each circuit cell. However, if a circuit having the structure shown in FIG. 4 is used as each common bias circuit 5, it is possible to supply the bias voltages $V_{REF}$ and $V_{CS}$ directly from the common bias circuit to each circuit. This is especially advantageous, for example, when the bias votages are supplied to input/output buffer circuits (not shown) disposed in the periphery of the semiconductor chip 7.

As mentioned above, according to the present invention, since only one kind of reference voltage is supplied from a common bias circuit to each inner bias circuit, it is possible to decrease the number of inner connection lines of an integrated circuit device, thus increasing the reliability and further increasing the degree of integration. It is also possible to make the power consumption much smaller than in an integrated circuit device comprising a bias portion for every logic circuit portion. In the integrated circuit device according to the present invention, it is possible to connect a plurality of logic portions to each inner bias circuit, and, therefore, the average power consumption per unit gate can be further decreased. Moreover, since the common bias circuit supplies only the reference voltage mainly used for determining the bias voltage $V_{CS}$, and the voltage level of the bias voltage $V_{REF}$ is determined in each inner bias circuit, for example, by adjusting the resistance of a base bias resistor, it is possible to generate the bias voltage $V_{REF}$ having the most appropriate voltage level for each logic portion. Therefore, according to the present invention, the flexibility of bias adjustment in an integrated circuit device becomes very large.

We claim:

1. An integrated circuit device comprising:
  a cell unit array having a plurality of cell units disposed in a central portion of a semiconductor chip;
  a first power supply line and a second power supply line on said chip; and
  at least one common bias generating portion disposed on said chip at the periphery of said cell unit array, each said common bias generating portion generating a respective single common bias voltage which differs from the potential of said second power supply line by a first constant value;
  each of said cell units including:
    at least one logic circuit portion each having at least a pair of logic transistors which are connected to said first power supply line and whose emitters are mutually connected, and a constant current source means connected to said second power supply line for supplying a constant current to said logic transistors; and
    an inner bias circuit which receives said common bias voltage and which generates a first inner bias voltage that is supplied to the base of a first one of the logic transistors and a second inner bias voltage that is supplied to said constant current source means;
  wherein the value of the respective second inner bias voltage differs from said common bias voltage by a second constant value, and the value of the respective first inner bias voltage differs from the potential of said first power supply line at the respective cell unit by a value determined according to the characteristic values of elements in the respective inner bias circuit and by said common bias voltage at the respective cell unit.

2. An integrated circuit device according to claim 1, wherein each said inner bias circuit comprises:
  a first transistor whose base receives said common bias voltage and whose emitter outputs the respective second inner bias voltage; and
  a second transistor whose base is connected to the collector of the respective first transistor and whose emitter outputs the respective first inner bias voltage.

3. An integrated circuit device according to claim 2, wherein each said inner bias circuit further comprises a third transistor whose collector is connected to the emitter of the respective sound transistor, whose base is connected to the base of the respective first transistor and whose emitter outputs the respective second inner bias voltage.

4. An integrated circuit device according to claim 2, wherein each said inner bias circuit further comprises a third transistor whose collector is connected to the emitter of the respective second transistor and whose base is connected to the emitter of the respective first transistor.

5. An integrated circuit device according to claim 2 or 3 or 4, wherein each said inner bias circuit further comprises a collector resistor connected between the collector of the respective first transistor and said first power supply line.

6. An integrated circuit device according to claim 5, wherein each said collector resistor has approximately a first resistance value independently of the location of the respective cell unit on said semiconductor chip.

7. An integrated circuit device according to claim 5, wherein the resistance of each said collector resistor is adjusted depending on the location of the respective cell unit on said semiconductor chip.

8. An integrated circuit device according to claim 1, wherein each said logic circuit cell comprises a pair of load resistors having first ends connected to the collectors of respective ones of said logic transistors and whose other ends are mutually connected, and an additional resistor connected between said first power supply line and said mutually connected other ends of said load resistors.

9. An integrated circuit device according to claim 8, wherein the resistance of each said additional resistor is adjusted depending on the location of the respective cell unit on said semiconductor chip.

10. An integrated circuit device having a plurality of circuit units each having an input terminal for receiving an input signal and an output terminal for providing an output signal in response to said input signal and a bias supply section for supplying voltage to said plurality of circuit units, said bias supply section comprising
 a common bias circuit which outputs a predetermined stabilized reference voltage, and
 a plurality of inner bias circuits, each of which corresponds to at least one of said circuit units, and each of which has at least one resistor and is connected to receive the output of said common bias circuit with a respective line voltage drop and supplies a plurality of predetermined stabilized bias voltages in common to each said corresponding circuit unit according to the value of said predetermined stabilized reference voltage as output by said common bias circuit, said stabilized bias voltages being adjusted so as to compensate for said respective line voltage drops.

11. An integrated circuit device having a plurality of circuit units each having an input terminal for receiving an input signal and an output terminal for providing an output signal in response to said input signal and a bias supply section for supplying voltage to said plurality of circuit units, said bias supply section comprising
 a common bias circuit which outputs a predetermined stabilized reference voltage,
 a plurality of inner bias circuits, each of which corresponds to at least one of said circuit units, and each of which has at least one resistor and is connected to receive the output of said common bias circuit with a respective line voltage drop and supplies a plurality of predetermined stabilized bias voltages in common to each said corresponding circuit unit according to the value of said predetermined stabilized reference voltage as output by said common bias circuit, and
 at least selected ones of said inner bias circuits have elements of respective values so that the values of the respective stabilized bias voltages supplied from different selected ones of said inner bias circuits are equal, independently of their locations.

12. The device of claim 11, wherein all of said inner bias circuits output the same values of said plurality of stabilized bias voltages.

13. The device of claim 11, wherein each said circuit unit has an input terminal for receiving an input digital signal and an output terminal for providing an output digital signal, and said output digital signal of all of said circuit units has the same voltage value for corresponding logic levels of the respective input signals.

* * * * *

UNITED STATES PATENT AND TRADEMARK OFFICE
CERTIFICATE OF CORRECTION

PATENT NO. : 4,678,935

DATED : JULY 7, 1987

INVENTOR(S) : KAZUMASA NAWATA ET AL.

Page 1 of 2

It is certified that error appears in the above-identified patent and that said Letters Patent is hereby corrected as shown below:

```
Col. 1, line 20, "redivise" should be --redevise--.

Col. 3, line 26, "of:" should be --of--;
        line 27, "of" should be --of:--.

Col. 6, line 44, "the" should be --a--;
        line 44, "voltage" should be --voltage that is--;
        line 65, "---," should be -- ---, connected between
                 the power supply line and the common end
                 of the resistors $R_1$ and $R_2$. The resistors
                 $R_{24}$, $R'_{24}$, ---, are changed in accordance
                 with the locations of the logic portions
                 14-1, 14-2, ---, --.

Col. 7, line 7, "---" should be -- ---, --;
        line 8, delete ",";
        line 10, "OUT 1," should be --OUT1,--;
```

UNITED STATES PATENT AND TRADEMARK OFFICE
CERTIFICATE OF CORRECTION

PATENT NO. : 4,678,935
DATED : JULY 7, 1987
INVENTOR(S) : KAZUMASA NAWATA ET AL.

It is certified that error appears in the above-identified patent and that said Letters Patent is hereby corrected as shown below:

Col. 7, line 18, "---. are" should be -- --- are--;
      line 58, "votages" should be --voltages--.
Col. 8, line 63, "sound" should be --second--.

Signed and Sealed this

Second Day of February, 1988

Attest:

DONALD J. QUIGG

Attesting Officer      Commissioner of Patents and Trademarks